United States Patent
Kim et al.

(10) Patent No.: US 9,847,142 B2
(45) Date of Patent: Dec. 19, 2017

(54) SEMICONDUCTOR APPARATUS AND REPAIR METHOD THEREOF

(71) Applicant: SK hynix Inc., Icheon-si Gyeonggi-do (KR)

(72) Inventors: Jong Sam Kim, Icheon-si (KR); Jin Hee Cho, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/919,844

(22) Filed: Oct. 22, 2015

(65) Prior Publication Data

US 2017/0040066 A1    Feb. 9, 2017

(30) Foreign Application Priority Data

Aug. 4, 2015 (KR) .................. 10-2015-0109980

(51) Int. Cl.
G11C 29/00 (2006.01)
G11C 29/24 (2006.01)
G11C 29/44 (2006.01)

(52) U.S. Cl.
CPC .............. *G11C 29/78* (2013.01); *G11C 29/24* (2013.01); *G11C 2029/4402* (2013.01)

(58) Field of Classification Search
CPC ......... G11C 17/18; G11C 11/16; G11C 29/78; G11C 29/76; G11C 29/04
See application file for complete search history.

(56) References Cited

U.S. PATENT DOCUMENTS

| | | | | |
|---|---|---|---|---|
| 5,134,585 A * | 7/1992 | Murakami | ........... | G11C 29/848 365/200 |
| 5,491,444 A * | 2/1996 | McClure | ............. | G11C 29/785 326/50 |
| 5,835,425 A * | 11/1998 | Berger | ................ | G11C 29/808 365/200 |
| 5,910,921 A * | 6/1999 | Beffa | ..................... | G11C 29/44 365/200 |
| 6,005,813 A * | 12/1999 | Waller | ................... | G11C 29/80 365/200 |
| 7,911,258 B2 * | 3/2011 | Suzuki | ................ | G11C 29/789 327/525 |
| 2003/0164510 A1 * | 9/2003 | Dono | ................... | G11C 29/785 257/200 |
| 2005/0050421 A1 * | 3/2005 | Enkaku | .................. | G11C 17/18 714/735 |
| 2006/0193185 A1 * | 8/2006 | Takai | .................. | G11C 17/143 365/200 |
| 2012/0314519 A1 * | 12/2012 | Lee | ...................... | G11C 29/702 365/200 |

FOREIGN PATENT DOCUMENTS

KR    1020170036884 A    4/2017

* cited by examiner

*Primary Examiner* — Douglas King
(74) *Attorney, Agent, or Firm* — William Park & Associates Ltd.

(57) ABSTRACT

A semiconductor apparatus includes a fuse array configured to store word line failure information, a redundancy latch section, and a redundancy control block configured to store, in the redundancy latch section, word line order information generated according to the word line failure information.

11 Claims, 5 Drawing Sheets

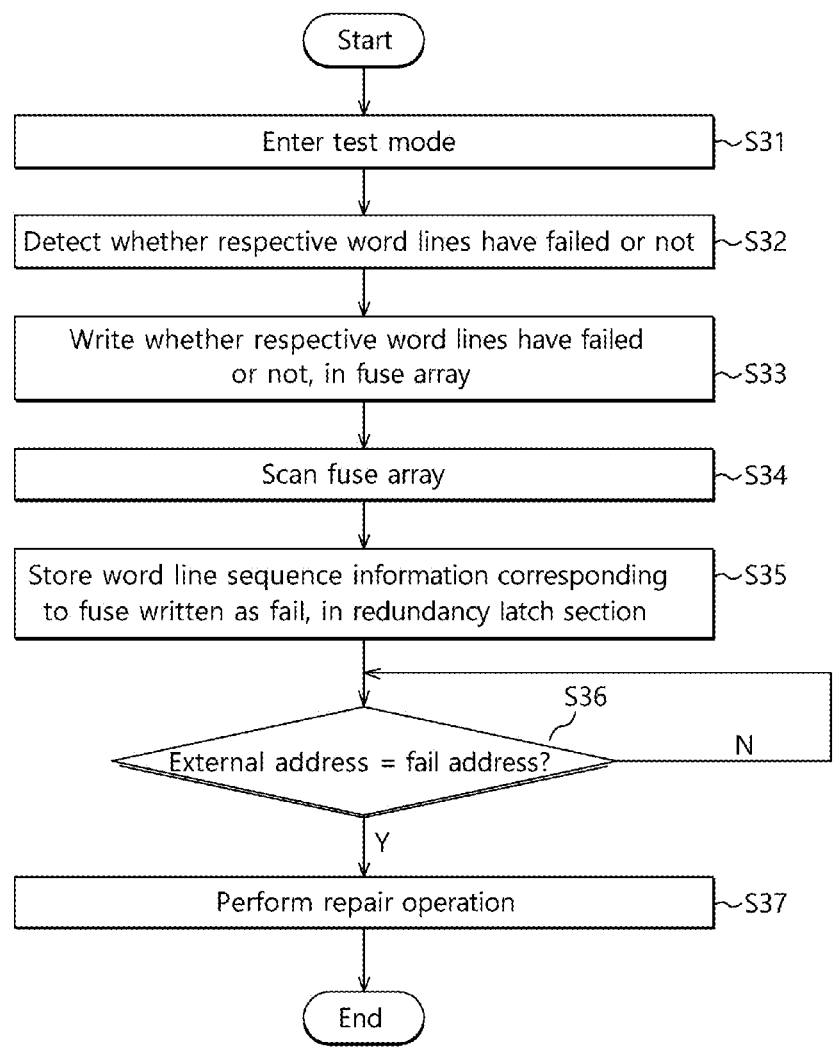

SEMICONDUCTOR APPARATUS AND REPAIR METHOD THEREOF

CROSS-REFERENCES TO RELATED APPLICATION

The present application claims priority under 35 U.S.C. §119(a) to Korean application number 10-2015-0109980 filed on Aug. 4, 2015, in the Korean Intellectual Property Office, which is incorporated herein by reference in its entirety.

BACKGROUND

1. Technical Field

Various embodiments generally relate to a semiconductor circuit, and more particularly to a semiconductor apparatus and a repair method thereof.

2. Related Art

A semiconductor repair is a process that replaces failed elements involving defective memory cells or defective data lines of the semiconductor chip with redundant memory cells and data lines included in the chip. A semiconductor apparatus may store failed addresses in fuses to map the failed addresses to addresses of the redundant memory cells and data lines.

Even after the semiconductor apparatus has been assembled in a package, the semiconductor repair may be performed by using e-fuses that allow fuse information to be updated through rupture operations.

SUMMARY

Various embodiments are directed to a semiconductor apparatus and a repair method thereof capable of reducing a circuit area and performing a stable repair operation.

In an embodiment, a semiconductor apparatus may include: a fuse array configured to store word line failure information; a redundancy latch section; and a redundancy control block configured to store word line sequence information generated according to the word line failure information, in the redundancy latch section.

In an embodiment, the fuse array may include a plurality of fuses which one-to-one match the plurality of word lines, and each of the plurality of fuses may store the word line fail information as a 1-bit signal.

In an embodiment, a method for repairing a semiconductor apparatus including a plurality of word lines may include: detecting whether each of the plurality of word lines has failed, in a test mode, and writing a detection result in a fuse array; generating a word line sequence information corresponding to a fuse in which occurrence of a fail is written, by scanning the fuse array; storing the word line sequence information; and performing a repair operation by using the word line sequence information.

In an embodiment, the writing of the detection result in the fuse array may include storing whether each of the plurality of word lines has failed, in each of a plurality of fuses of the fuse array, by a 1-bit signal.

BRIEF DESCRIPTION OF THE DRAWINGS

FIG. 5 is a flow chart provided to assist in explaining a repair method according to FIG. 3.

DETAILED DESCRIPTION

Hereinafter, a semiconductor apparatus and a repair method thereof will be described below with reference to the accompanying drawings through various examples of embodiments.

Figure 1:
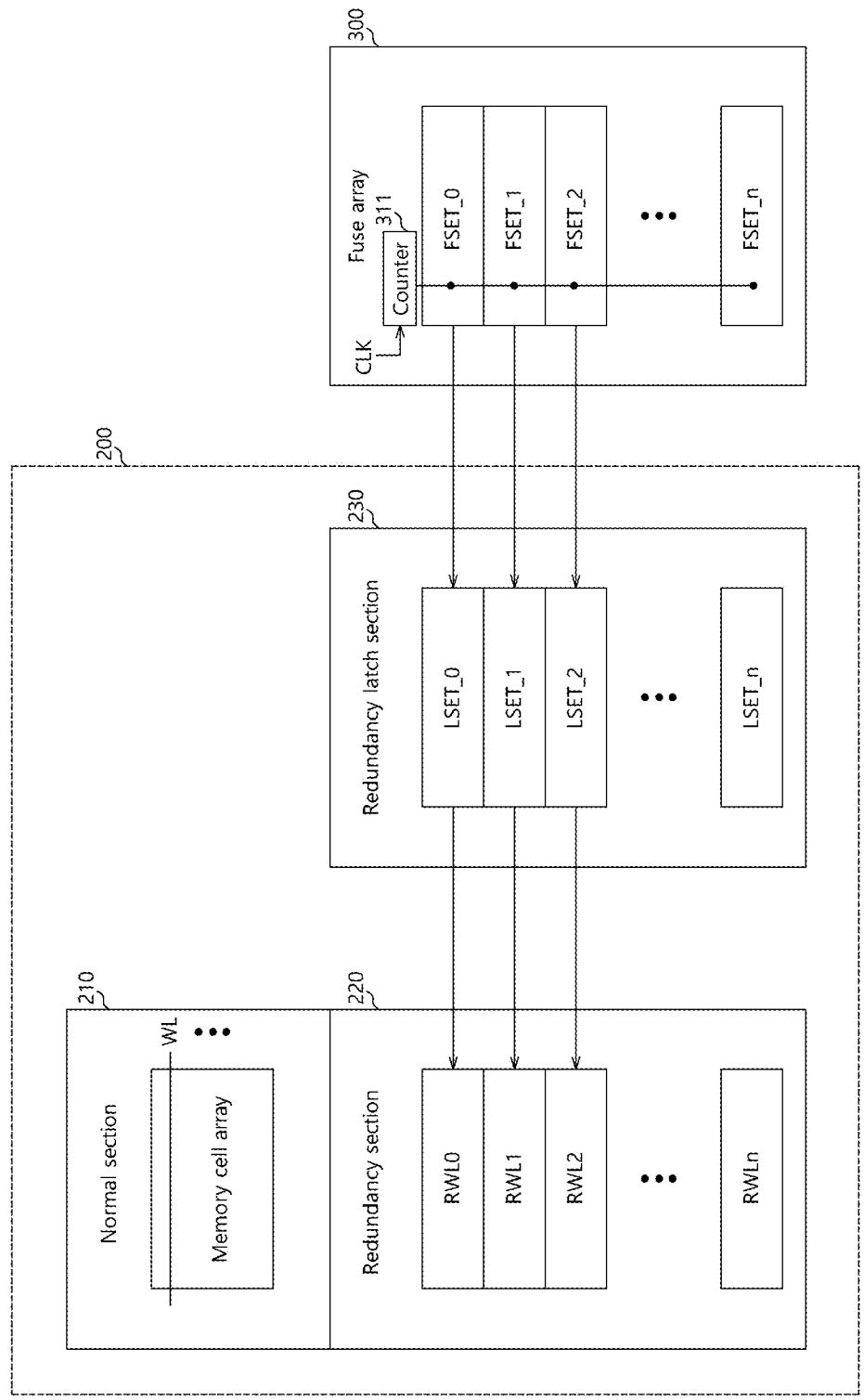
FIG. 1 is a diagram illustrating an example of a semiconductor apparatus 100 in accordance with an embodiment.

As shown in FIG. 1, a semiconductor apparatus 100 in accordance with an embodiment may include a memory region 200 and a fuse array 300.

The memory region 200 may include a normal section 210, a redundancy section 220, and a redundancy latch section 230.

The normal section 210 may include a memory cell array and a plurality of word lines WL.

The memory cell array of the normal section 210 may consist of small unit memory blocks such as 'mats' or large unit memory blocks such as 'banks.'

The redundancy section 220 may include a plurality of redundancy word lines RWL0 to RWLn for replacing word lines corresponding to failed address. The word lines corresponding to failed address may include, among the plurality of word lines WL, word lines coupled to failed memory and failed word lines.

The redundancy latch section 230 may store failed addresses associated with failed memory cells and failed data lines.

The redundancy latch section 230 may include a plurality of latch sets LSET_0 to LSET_n.

The plurality of latch sets LSET_0 to LSET_n and the plurality of redundancy word lines RWL0 to RWLn may be in one-to-one correspondence.

Each of the plurality of latch sets LSET_0 to LSET_n may include a plurality of latches.

For example, provided that a failed address is an address signal that has thirteen bits, each latch set LSET_0 to LSET_n may include thirteen latches.

The fuse array 300 may store failed addresses by rupturing fuses.

The fuse array 300 may include a counter 310 and a plurality of fuse sets FSET_0 to FSET_n.

Each fuse sets FSET_0 to FSET_n may include a plurality of e-fuses.

For example, provided that a failed address is an address signal that has thirteen bits, each fuse set FSET_0 to FSET_n may include thirteen e-fuses.

A rupture operation is an operation that ruptures a gate insulation layer of an e-fuse formed of a transistor by applying a predetermined voltage thereto.

In an embodiment, the plurality of fuse sets FSET_0 to FSET_n and the plurality of latch sets LSET_0 to LSET_n may be in one-to-one correspondence.

The counter 310 may sequentially read out failed addresses written in the plurality of fuse sets FSET_0 to FSET_n in response to a clock signal CLK.

Figure 2:
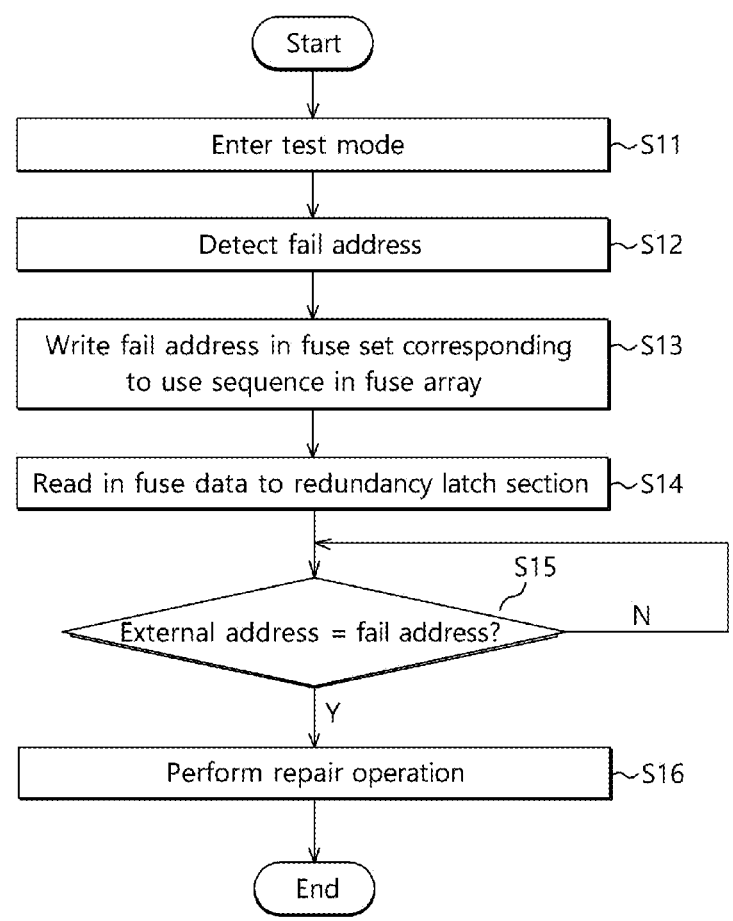
FIG. 2 is a flow chart provided to assist in explaining a repair method according to FIG. 1.

The repair operation of the semiconductor apparatus 100 in accordance with an embodiment will be described below with reference to FIG. 2.

The repair operation of the semiconductor apparatus 100 may include a plurality of steps S11 to S16. In the step S11, the semiconductor apparatus 100 enters a test mode.

In the test mode, a test is performed on the memory cell array of the normal section 210, and failed addresses are detected in the step S12.

In the step S13, the failed addresses, which are detected in the step S12, are stored in a fuse set in a way that the fuses of the fuse array 300 are programmed in a predetermined order by using the rupture operation described above. In an embodiment, the fuses of the fuse array 300 may store order information regarding the failed word line (e.g., information showing that the failed word line is nth word line.)

For example, if a number is assigned to each fuse set FSET_0 to FSET_n, the plurality of fuse sets FSET_0 to FSET_n may be programmed in numerical order.

That is to say, the first fuse set FSET_0 among the plurality of fuse sets FSET_0 to FSET_n is ruptured to store a first failed address, and then the second fuse set FSET_1 is ruptured to store a second failed address.

In the step S14, the failed addresses stored in the plurality of fuse sets FSET_0 to FSET_n of the fuse array 300 are read and the plurality of corresponding latch sets LSET_0 to LSET_n of the redundancy latch section 230 may store the failed addresses.

The step S14 may be performed using the counter 310 of the fuse array 300 in a boot-up process of the semiconductor apparatus 100.

In the step S15, in a normal operation mode, the semiconductor apparatus 100 determines whether an address provided from outside the semiconductor apparatus 100 (hereinafter, referred to as "external address") corresponds to a failed address stored in the redundancy latch section 230.

If it is determined that the external address corresponds to a failed address stored in the redundancy latch section 230, a repair operation is performed in the step S16.

In the repair operation of the step S16, a redundancy word line of the redundancy section 220 may be activated in place of a word line of the normal section 210 corresponding to a failed address.

For example, if the failed address stored in the first latch set LSET_0 of the redundancy latch section 230 corresponds to the external address, the first redundancy word line RWL0, which is in one-to-one correspondence with the latch set LSET_0 may be activated.

For example, if the failed address stored in the fourth latch set LSET_3 of the redundancy latch section 230 corresponds to the external address, the fourth redundancy word line RWL3, which is in one-to-one correspondence with the fourth latch set LSET_3 may be activated.

Hereinbelow, a semiconductor apparatus 101 in accordance with another embodiment and a repair method thereof will be described with reference to FIGS. 3 to 5.

Figure 3:
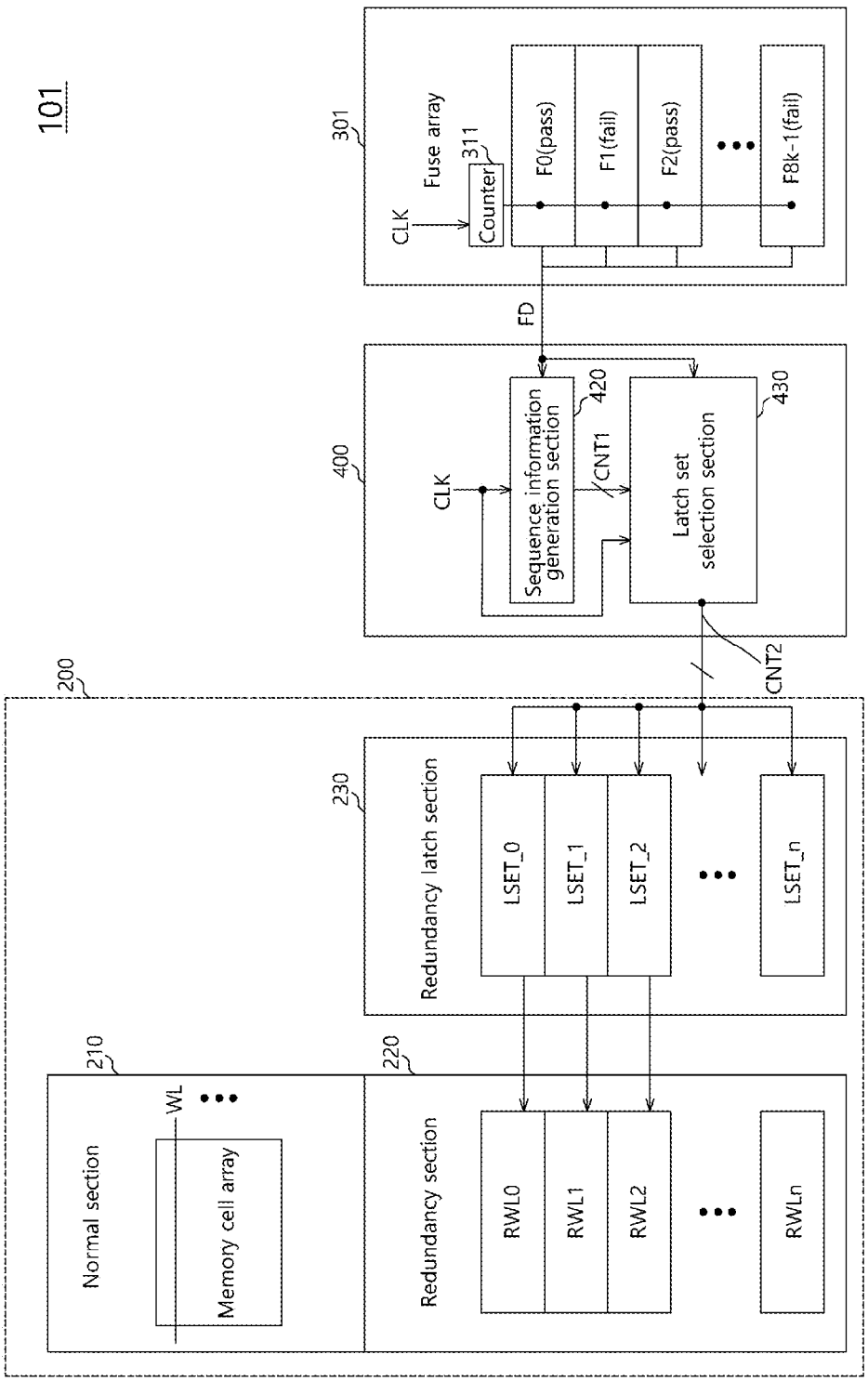
FIG. 3 is a diagram illustrating an example of a semiconductor apparatus 101 in accordance with another embodiment.
Figure 4:
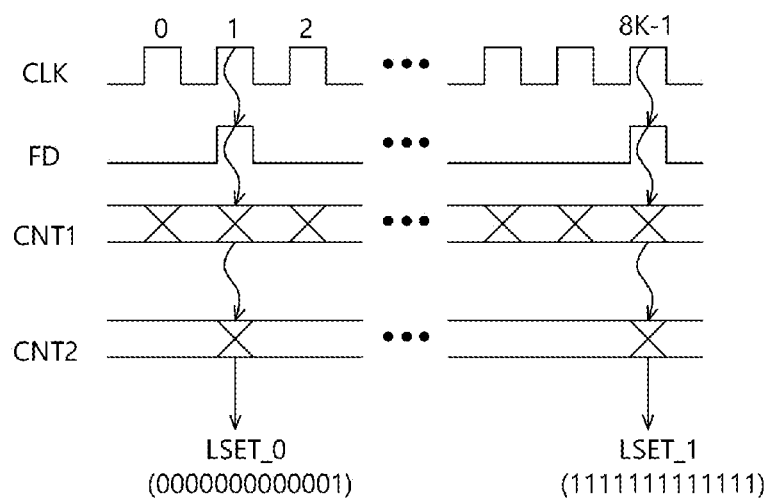
FIG. 4 is a timing diagram provided to assist in explaining the operation of a redundancy control block 400 shown in FIG. 3.

As shown in FIG. 3, a semiconductor apparatus 101 in accordance with another embodiment may include a memory region 200, a fuse array 301, and a redundancy control block 400.

The memory region 200 may include a normal section 210, a redundancy section 220, and a redundancy latch section 230.

The normal section 210 may include a memory cell array and a plurality of word lines WL.

The memory cell array of the normal section 210 may consist of small unit memory blocks such as 'mats' or large unit memory blocks such as 'banks.'

If a failed memory cell exists in the memory cell array of the normal section 210, a word line coupled to the failed memory cell may also be determined as a failed word line.

The redundancy section 220 may include a plurality of redundancy word lines RWL0 to RWLn for replacing the failed word lines among the plurality of word lines WL.

The redundancy latch section 230 may store addresses of word lines determined to be failed.

The addresses of word lines determined to be failed may have the same values as the failed addresses described above with reference to FIGS. 1 and 2.

The redundancy latch section 230 may include a plurality of latch sets LSET_0 to LSET_n.

The plurality of latch sets LSET_0 to LSET_n and the plurality of redundancy word lines RWL0 to RWLn may be in one-to-one correspondence.

Each of the plurality of latch sets LSET_0 to LSET_n may include a plurality of latches.

For example, provided that a failed address is an address signal that has thirteen bits, each latch set LSET_0 to LSET_n may include thirteen latches.

The fuse array 301 may store failed addresses with respect to the plurality of word lines WL of the normal section 210 by rupturing fuses.

The fuse array 301 may include a counter 311 and a plurality of fuses F0 to F8$k$–1. In an embodiment, e-fuses may be used as the plurality of fuses F0 to F8$k$–1.

A number of the plurality of fuses F0 to F8$k$–1 may be determined based on a number of word lines WL0 to WL8$k$–1 included in the normal section 210.

The plurality of fuses F0 to F8$k$–1 and the plurality of word lines WL0 to WL8$k$–1 of the normal section 210 may be in one-to-one correspondence.

The fuse array 301 may store, in the plurality of fuses F0 to F8$k$–1, word line failure information FD, which indicates whether respective word lines WL0 to WL8$k$–1 have failed or not. The fuses corresponding to the failed word lines may store one or a logic high level and a logic low level as the word line failure information FD. In an embodiment, the word line failure information FD may have a single-bit.

For example, the fuses corresponding to the failed word lines may store the logic high level, and the fuses corresponding to normal word lines may store a logic low level.

The counter 311 may sequentially output signals by counting the logic high levels, which indicate failed addresses, from the word line failure information FD.

The redundancy control block 400 may store word line order information CNT2 generated according to the word line failure information FD in a latch set of the redundancy latch section 230 in a predetermined order. For example, if a number is assigned to each latch set of the redundancy latch section 230, a plurality of latch sets may store the word line order information CNT2 in numerical order. In an embodiment, the word line order information CNT2 may have order information regarding the failed word line (e.g., information showing that the failed word line is nth word line.)

The redundancy control block 400 may include an order information generation section 420 and a latch set selection section 430.

The order information generation section 420 may generate pre word line order information CNT1 according to the clock signal CLK and the word line failure information FD.

The order information generation section 420 may sequentially increase an internal count value according to the clock signal CLK, and output the pre word line order information CNT1 by capturing an internal count value at the timing when the word line failure information FD has a value indicating a word line failure.

While the word line order information CNT2 is generated by increasing an internal count value in the order information generation section 420, counting may be performed based on the failed addresses of the embodiment described above with reference to FIGS. 1 and 2.

Therefore, word line order information CNT2 may have the same values as the failed addresses described above with reference to FIGS. 1 and 2.

The order information generation section 420 may output the pre word line order information CNT1 by capturing an internal count value in the case where the word line failure information FD is the logic high level.

The order information generation section 420 may include a counter.

The latch set selection section 430 may store the pre word line order information CNT1 as the word line order information CNT2 by selecting one among the plurality of latch sets LSET_0 to LSET_n of the redundancy latch section 230 according to the clock signal CLK and the word line failure information FD.

The latch set selection section 430 may sequentially select the plurality of latch sets LSET_0 to LSET_n of the redundancy latch section 230 based on the clock signal CLK each time word line failure information FD has the logic high level.

The latch set selection section 430 may store the pre word line order information CNT1 as the word line order information CNT2 in a latch set currently selected among the plurality of latch sets LSET_0 to LSET_n of the redundancy latch section 230.

The latch set selection section 430 may include a counter.

The operation of the redundancy control block 400 will be described below with reference to FIG. 4.

For example, when assuming that the word lines WL1 and WL8$k$–1 among the plurality of word lines WL0 to WL8$k$–1 have been determined to be failed, the logic high level may be stored in the fuses F1 and F8$k$–1 among the plurality of fuses F0 to F8$k$–1.

The word line failure information FD may have the logic high level at the timing of the second clock pulse.

While increasing a count value (e.g., thirteen bits) according to the clock signal CLK, the order information generation section 420 may output a count value '0000000000001' as the pre word line order information CNT1.

The latch set selection section 430 may store, in the latch set LSET_0, '0000000000001' as the word line order information CNT2 as the word line failure information FD.

The word line failure information FD may have the logic high level at the timing of the last clock pulse among the clock pulses.

The order information generation section 420 may output a count value '1111111111111' as the pre word line order information CNT1.

The latch set selection section 430 may store, in the latch set LSET_1 which comes right after the latch set LSET_0, '1111111111111' as the word line order information CNT2 as the word line failure information FD.

The repair operation of the semiconductor apparatus 101 in accordance with an embodiment will be described below with reference to FIG. 5.

The repair operation of the semiconductor apparatus 101 may include a plurality of steps S31 to S37. In the step S31, the semiconductor apparatus 101 enters a test mode.

In the test mode, a test is performed on the normal section 210, and failed addresses are detected in the step S32.

In the step S33, the failed addresses, among the word lines WL0 to WL8$k$–1, are stored in the plurality of fuses F0 to F8$k$–1, which are in one-to-one correspondence with the word lines WL0 to WL8$k$–1, through the rupture operation as described above.

In the step S34, a fuse array scan operation is performed (S34).

In the fuse array scan operation, the order information generation section 420 reads the fuse data sequentially outputted by the counter 311 of the fuse array 301, that is, the word line failure information FD stored in the plurality of fuses F0 to F8$k$–1.

In the step S35, the word line order information CNT2 corresponding to fuses that have been programmed with respect to failed addresses is stored in the redundancy latch section 230.

The step S35 may be an operation that the latch set selection section 430 stores the word line order information CNT2 by selecting one among the plurality of latch sets LSET_0 to LSET_n according to the word line failure information FD having the logic high level.

The step S35 may be performed in the boot-up process of the semiconductor apparatus 101.

In the step S36, in a normal operation mode, the semiconductor apparatus 101 determines whether the external address corresponds to a failed address stored in the redundancy latch section 230.

While the word line order information CNT2 is generated by increasing an internal count value in the order information generation section 420, counting may be performed based on the failed addresses of the embodiment described above with reference to FIGS. 1 and 2.

Therefore, the word line order information CNT2 may have the same values as the failed addresses described above with reference to FIGS. 1 and 2.

If it is determined that the external address corresponds to a failed address stored in the redundancy latch section 230, a repair operation is performed in the step S37.

In the repair operation of the step S37, a redundancy word line of the redundancy section 220 may be activated in place of a word line of the normal section 210 corresponding to a failed address.

For example, if the failed address stored in the first latch set LSET_0 of the redundancy latch section 230 corresponds to the external address, the first redundancy word line RWL0, which is in one-to-one correspondence with the latch set LSET_0 may be activated.

For example, if the failed address stored in the second latch set LSET_1 of the redundancy latch section 230 corresponds to the external address, the second redundancy word line RWL1, which is in one-to-one correspondence with the second latch set LSET_1 may be activated.

While various embodiments have been described above, it will be understood to those skilled in the art that the embodiments described are examples only. Accordingly, the semiconductor apparatus and the repair method thereof described herein should not be limited based on the described embodiments.

What is claimed is:

1. A semiconductor apparatus comprising:
   a fuse array configured to store word line failure information;
   a redundancy latch section; and
   a redundancy control block configured to store, in the redundancy latch section, word line order information generated according to the word line failure information, wherein the fuse array comprises a plurality of fuses, each of the plurality of fuses stores the word line failure information as a single-bit for indicating whether a corresponding word line of the plurality of word lines has failed or not.

2. The semiconductor apparatus according to claim 1, further comprising:
a plurality of word lines and a plurality of redundancy word lines,
wherein the semiconductor apparatus is configured to, when an external address corresponds to word line order information, replace a word line corresponding to the external address with one of the plurality of redundancy word lines.

3. The semiconductor apparatus according to claim 1, wherein:
the fuse array comprises a plurality of fuses which is in one-to-one correspondence with the plurality of word lines; and
each of the plurality of fuses stores the word line failure information corresponding word line of the plurality of word lines as a single-bit.

4. The semiconductor apparatus according to claim 1, wherein the redundancy latch section, included in a memory region, comprises a plurality of latch sets.

5. The semiconductor apparatus according to claim 4, wherein the redundancy control block stores the word line order information in latch sets corresponding to predetermined order among the plurality of latch sets.

6. The semiconductor apparatus according to claim 1, wherein the redundancy control block comprises:
a order information generation section configured to sequentially increase an internal count value according to a clock signal, and output pre word line order information by capturing an internal count value at a timing when the word line failure information is generated; and
a latch set selection section configured to store the pre word line order information as the word line order information by selecting one among the plurality of latch sets of the redundancy latch section according to the word line failure information.

7. The semiconductor apparatus according to claim 6, wherein the latch set selection section is configured to sequentially select the plurality of latch sets each time the word line failure information is generated.

8. The semiconductor apparatus according to claim 1, wherein the fuse array comprises:
a plurality of fuses; and
a counter configured to sequentially output signals by counting certain logic levels, which indicates failed addresses, from the word line failure information.

9. The semiconductor apparatus according to claim 1, wherein the word line order information has order information showing that the failed word line is nth word line.

10. A semiconductor apparatus comprising:
a memory region includes a memory cell array, a plurality of word lines and a redundancy latch section;
a plurality of fuses configured to store word line failure information of a corresponding word line of the plurality of word lines; and
a redundancy control block configured to store, in the redundancy latch section, word line order information generated according to the word line failure information,
wherein each of the plurality of fuses stores the word line failure information as a single-bit for indicating whether the corresponding word line has failed or not.

11. The semiconductor apparatus according to claim 10, wherein the redundancy control block comprises:
an order information generation section configured to sequentially increase an internal count value according to a clock signal, and output pre word line order information by capturing an internal count value at a timing when the word line failure information is generated; and
a latch set selection section configured to store the pre word line order information as the word line order information by selecting one among the plurality of latch sets of the redundancy latch section according to the word line failure information.

* * * * *